United States Patent [19]
Holt

[11] 4,015,136
[45] Mar. 29, 1977

[54] ELECTRICAL SYSTEMS FOR ROAD VEHICLES

[75] Inventor: William David Holt, Colne, England

[73] Assignee: Lucas Electrical Company Limited, Birmingham, England

[22] Filed: Sept. 16, 1975

[21] Appl. No.: 613,807

[30] Foreign Application Priority Data
Sept. 19, 1974 United Kingdom .............. 40843/74

[52] U.S. Cl. ............................. 307/10 R; 315/77; 307/10 LS; 340/163
[51] Int. Cl.² ........................................ H02J 1/08
[58] Field of Search .............. 307/10 R, 10 LS, 41; 315/77, 78, 83; 317/139, 140, 157; 340/163, 168, 169

[56] References Cited
UNITED STATES PATENTS
3,683,197  8/1972  Ives .................................. 307/10

Primary Examiner—Herman J. Hohauser
Attorney, Agent, or Firm—Holman & Stern

[57] ABSTRACT

A road vehicle electrical system includes a plurality of switches controlling remote loads. The system makes use of voltage sensitive control devices which are operated in synchronism to connect each switch to its load periodically via a conductor which is common to all the load/switch control circuits. A further common conductor conveys a control voltage signal in the form of a repeated staircase wave form to all the control devices. Analogue signal generators and detectors may also share the common conductor under the control of the same wave form generator.

3 Claims, 5 Drawing Figures

ELECTRICAL SYSTEMS FOR ROAD VEHICLES

This invention relates to electrical systems for road vehicles and has as an object to provide such a system in a convenient form.

An electrical system in accordance with the invention comprises a plurality of electrical loads, a plurality of switches for controlling the respective loads, at least some of the loads being remote from their associated switches, a plurality of load control devices selectively operable for connecting the loads to a common conductor, a plurality of switch control devices selectively operable for connecting the switches to the common conductor and scanning means for sequentially operating the load control devices one at a time and for synchronously operating the switch control devices so that each load is periodically connected to its associated switch.

Preferably, each load control device includes a latch circuit which is resettable after a time delay exceeding the period between successive connections of the load to its associated switch.

The scanning means may include a further conductor connected to all of the switch control devices and all of the load control devices, each control device including a voltage level detecting circuit which renders the control device operative when an appropriate control signal voltage level is present on the further conductor, the levels at which the switch control devices are operative being different and each load control device being operative at the same level as its associated switch control device, and a control signal generator for applying to said further conductor a cyclically repeated sequence of control signal voltage levels to render the control devices operative sequentially.

Conveniently the control signal generator is adapted to generate a staircase waveform.

An example of the invention is shown diagrammatically in the accompanying drawings, in which.

Figure 1:
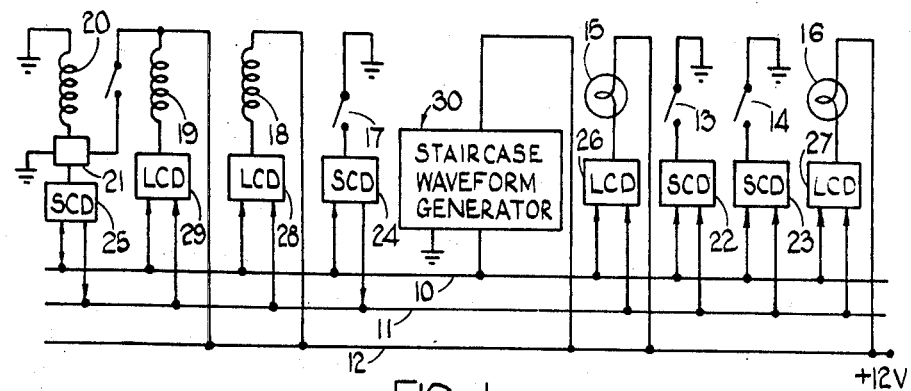
FIG. 1 is a block diagram of part of the road vehicle electrical system.

Referring firstly to FIG. 1 the system consists essentially of a harness made up of three insulated conductors 10, 11 and 12 which extend around the vehicle to every load and switch which is to be included in the system. By way of example FIG. 1 shows two groups of loads and switches which may be on a control panel and in the engine compartment respectively. In the former group there are two switches 13 and 14 and two warning lamps 15 and 16. In the latter group there is a switch 17 intended to control the lamp 16, a load 18 controlled by the switch 13, a load in the form of a relay 19 which is controlled by switch 14 and which controls a higher power load 20 and a monitoring switch 21 under the contol of the relay 19 and adapted to be closed when the load 20 malfunctions. The monitoring switch 21 controls the lamp 15. Each of the switches 13, 14, 17 and 21 is connected to an associated switch control device 22, 23, 24 or 25 which, when operative connects the associated switch to the conductor 11. When any of the switches is closed the conductor 11 is connected to the vehicle earth whenever the associated switch control device is operative.

The lamps 15 and 16 the load 18 and the relay 19 are connected between the conductor 12, which is a conductor having a relatively high current carrying capacity, at the positive battery voltage, and associated load control devices 26, 27, 28 and 29 which, when operative establish a connection between the associated load and the conductor 11. Thus when, one of the load control devices, say 28, and the associated switch control device 23 are both operative simultaneously, the load 18 is actually controlled by the switch 23.

The remaining conductor 10 is connected to all of the load and switch control devices and provides these with synchronising signals so that each switch control device and its associated load control device are rendered operative periodically in synchronism. The synchronising signal applied to the conductor 10 is a staircase waveform generated by a generator 30.

Figure 2:
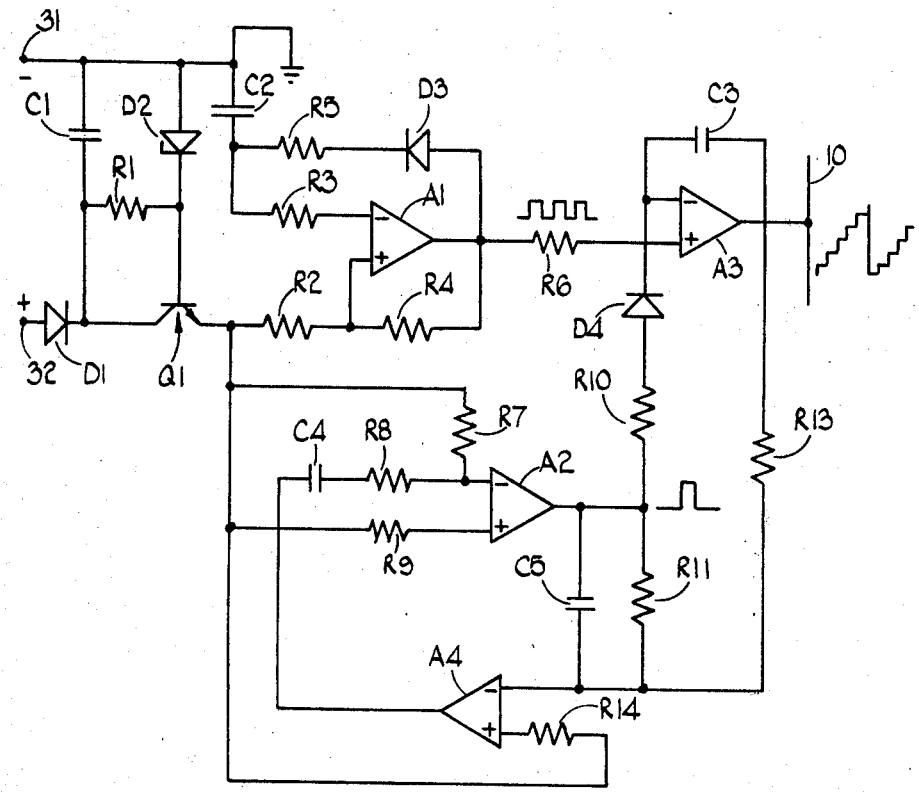
FIG. 2 is a circuit diagram of a staircase waveform generator which forms part of the system shown in FIG. 1.

The generator 30 is shown in more detail in FIG. 2 and makes use of an integrated circuit comprising four voltage comparators $A_1$, $A_2$, $A_3$ and $A_4$. The generator has input terminals 31 and 32 for connection to the negative and positive terminals of the vehicle battery. A diode $D_1$ has its anode connected to the terminal 32 and its cathode connected to the collector of an n-p-n transistor $Q_1$ and also via a resistor $R_1$ to the base of the transistor $Q_1$. The cathode of the diode $D_1$ is also connected via a capacitor $C_1$ to the terminal 31 and a zener diode $D_2$ has its cathode connected to the base of the transistor $Q_1$ and its anode connected to the terminal 31. The diode $D_1$ protects the generator against reverse connection to the battery and also serves, in conjuction with the capacitor $C_1$ to decouple the generator from the battery. The resistor $R_1$, zener diode $D_2$ and transistor $Q_1$ form a voltage stabiliser, the transistor $Q_1$ acting as an emitter follower.

The emitter of the transistor $Q_1$ is connected via a resistor $R_2$ to the non-invert input terminal of the comparator $A_1$ and the invert terminal of this comparator is connected via a resistor $R_3$ to one terminal of a capacitor $C_2$ the other terminal of which is connected to the terminal 31. A resistor $R_4$ connects the output terminal of the comparator $A_1$ to the non-invert terminal thereof. The output terminal of the comparator $A_1$ is also connected to the anode of a diode $D_3$ the cathode of which is connected by a resistor $R_5$ to said one terminal of the capacitor $C_2$.

The comparator $A_1$ and its associated components act as a pulse generator with the capacitor $C_2$ charging through the diode $D_3$ and the resistor $R_5$ whenever the output of the comparator is positive and discharging through the resistor $R_3$ and the input impedance of the comparator whenever the voltage across the capacitor $C_1$ exceeds the output voltage of the comparator $A_1$.

The output terminal of the comparator $A_1$ is connected by a resistor $R_6$ to the non-invert terminal of the comparator $A_3$. A capacitor $C_3$ connects the output terminal of the comparator $A_3$ to its invert terminal so that the comparator $A_3$ acts as an integrator. A reset circuit to be described hereinafter is connected to the invert terminal of the comparator $A_3$ through a diode $D_4$ which has its cathode connected to the invert terminal.

The reset circuit uses the two remaining comparators $A_2$ and $A_4$. The comparator $A_2$ has its non-invert terminal connected via a resistor $R_7$ to the emitter of the transistor $Q_1$ and also via a resistor $R_8$ and a capacitor $C_4$ in series to the output terminal of the comparator $A_4$. The non-invert terminal of the comparator $A_2$ is connected via a resistor $R_9$ to the emitter of the transistor $Q_1$. The comparator $A_2$ produces a short positive going pulse whenever the output of the comparator $A_4$ falls. The output terminal of the comparator $A_2$ is connected by a resistor $R_{10}$ to the anode of the diode $D_4$ so as to reset the integrator by discharging the capacitor $C_3$ whenever this positive-going pulse appears. The output terminal of the comparator $A_2$ is also connected by a resistor $R_{11}$ and a capacitor $C_5$ in parallel to the invert terminal of the comparator $A_4$ which is also connected by a resistor $B_{12}$ to the output terminal of the comparator $A_3$. A resistor $R_{14}$ connects the non-invert terminal of the comparator $A_4$ to the emitter of the transistor $Q_1$. When the output of the comparator $A_3$ reaches a predetermined level (dependent on the values of $R_{13}$ and $R_{14}$) relative to the voltage at the emitter of the transistor $Q_1$, the comparator $A_3$ switches from its high state to its low state so that its output falls to cause the comparator $A_2$ to produce its positive-going integrator reset pulse. This pulse is also applied to the invert terminal of the comparator $A_4$ to ensure that this does not switch back to its high output state before the capacitor $C_3$ is fully discharged.

Figure 3:
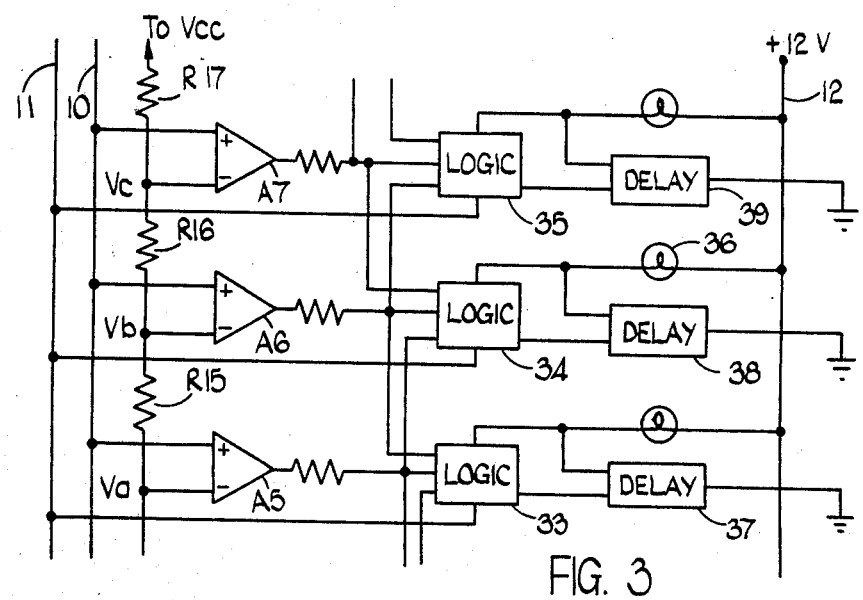
FIG. 3 is a circuit diagram of a load control device of which there are several in the system.

Turning now to FIG. 3 there is shown therein, more detail of a group of the load control devices. A resistance chain $R_{15}$, $R_{16}$, $R_{17}$ etc., sets up voltages $V_a$, $V_b$, $V_c$ etc., lying between the voltage levels of the staircase waveform generator. Comparators $A_5$, $A_6$, $A_7$ etc., have their invert terminals connected to the interconnections of the resistors $R_{15}$, $R_{16}$, $R_{17}$ etc., and each has its invert terminal connected to the conductor 10. There is a logic circuit 33, 34, 35 associated with each load which connects the load to the conductor 11 when the voltage level on the line 10 is between the levels $V_a$, $V_b$, $V_c$ etc., of two of the comparators $A_5$, $A_6$, $A_7$ etc., connected to the logic circuit. Thus, for example, if there are to be voltage levels at ½V intervals on the line 10, the levels $V_b$, $V_c$ would be, for example 1¾V and 2¼V. The outputs of comparators $A_6$ and $A_7$ are connected to the logic circuit 34 to control a load lamp 36. Whenever the 2V level is present on the conductor 10 the logic circuit 34 will connect the lamp 36 to the conductor 11, but this connection will be broken when the level is 1¾V or lower or 2¼V or higher.

Each of the load control devices also includes a delay circuit 37, 38, 39 etc., for maintaining the connection to earth, which is established when the switch associated with any given load is closed, for a time exceeding the cycle repetition period of the staircase waveform generator.

Figure 4:
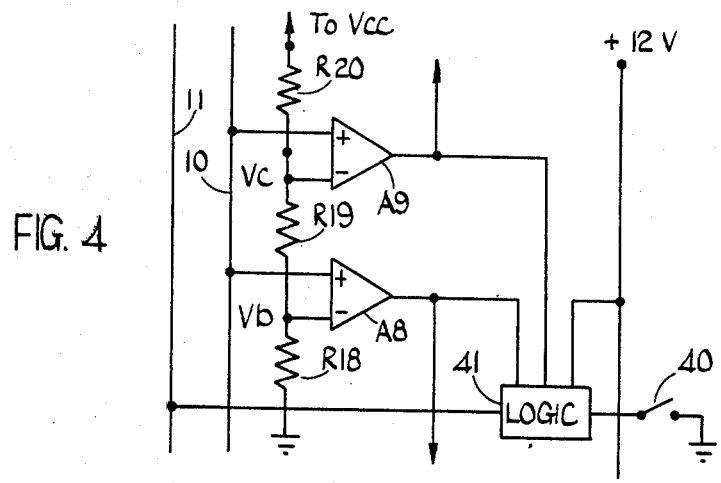
FIG. 4 is a circuit diagram of a switch control device of which there are several in the system.

FIG. 4 shows the circuit components forming one of the switch control devices. Once again a resistance chain $R_{18}$, $R_{19}$, $R_{20}$ etc., sets up voltages between the staircase waveform voltage levels and comparators $A_8$, $A_9$ compare these with the signal on conductor 10. A logic circuit 41 controls connection of the switch 40 to the conductor 11 as in the load control devices.

Where switches or loads are grouped together they may share the same resistance chain, comparators and a voltage stabiliser energising the resistance chain. However, a single switch or load may have its own resistance chain, comparators and voltage stabiliser.

Although ½V steps have been mentioned above the system described is thought to be capable of operating with much smaller steps as small as 5mV could be resolved giving a possibility of up to 1,200 channels using 6V stabilised supplies.

Figure 5:
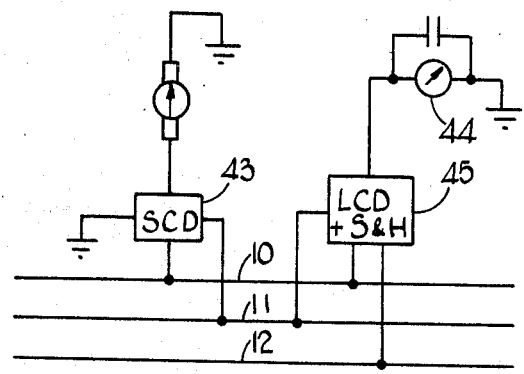
FIG. 5 is a block diagram illustrating the inclusion of a speedometer or tachometer in the system.

As shown in FIG. 5, a speedometer or tachometer can be included in the system. The speedometer has a generator 42 with one side earthed and the other side connected to one of the switch control devices 43, connected as before to the conductors 10 and 11. The device 43 is assumed to be capable, when operative, of applying a variable signal level to the conductor 10 as distinct from merely selectively grounding the conductor as in the examples described above. The speedometer also includes a remote meter 44 connected to the conductors 10, 11 and 12 by a load control device 45 like those described above but modified by the addition of a sample and hold circuit. Thus whenever the devices 43 and 45 are operative the sample and hold circuit, which may comprise a high input impedance f.e.t. arrangement with its gate earthed through a capacitor of such capacity that it does not discharge significantly through input impedance between scanning cycles, is supplied with an updated speed signal from the generator 43. The meter 44 continues to draw a substantially constant current from the f.e.t. arrangement.

Where the vehicle includes an anti-slip braking system, individual wheel speed sensing generators may be connected in similar manner to the brake control circuit. In this case the sample and hold circuit could be included in the brake control circuit.

I claim:

1. In an electrical system for a road vehicle including a plurality of electrical loads, a plurality of swtiches for controlling the respective loads, at least some of the loads being remote from their associated switches, a plurality of load control devices selectively operable for connecting the loads to a common conductor, a plurality of switch control devices selectively operable for connecting the switches to the common conductor, and scanning means for sequentially operating the load control devices one at a time and for synchronously operating the switch control devices so that each load is periodically connected to its associated switch, and wherein each load control circuit includes a latch circuit which is reset after a time delay exceeding the period between successive connections of the load to its switch means, the improvement in which said scanning means includes a further conductor connected to all of the switch control devices and all of the load control devices, each control device including a voltage level detecting circuit which renders the control device operative when an appropriate control signal voltage level is present on the further conductor, the levels at which the switch control devices are operative being different and each load control device being operative at the same level as its associated switch control device, and a control signal generator for applying to said further conductor a cyclically repeated sequence of control signal voltage levels to render the control devices operative sequentially.

2. A system as claimed in claim 1 in which said control signal generator is a staircase waveform generator.

3. A system as claimed in claim 1 further comprising at least one analogue signal generating device connectable by a switch control device to the common conductor, an analogue signal responsive device synchronously connected by a load control device incorporating an analogue signal sample and hold circuit to the common conductor.

* * * * *